United States Patent [19]

DoMinh et al.

[11] Patent Number: 4,684,599

[45] Date of Patent: Aug. 4, 1987

[54] PHOTORESIST COMPOSITIONS CONTAINING QUINONE SENSITIZER

[75] Inventors: Thap DoMinh, Rochester; James C. Fleming, Webster, both of N.Y.; Michael J. Lindstrom, Downingtown, Pa.

[73] Assignee: Eastman Kodak Company, Rochester, N.Y.

[21] Appl. No.: 885,122

[22] Filed: Jul. 14, 1986

[51] Int. Cl.$^4$ .............................................. G03C 1/495
[52] U.S. Cl. .................................... 430/270; 430/326; 430/296; 430/919; 430/923
[58] Field of Search .............. 430/270, 326, 296, 919, 430/923

[56] References Cited

U.S. PATENT DOCUMENTS

| | | |
|---|---|---|
| 3,462,267 | 8/1969 | Giangualano et al. ................. 96/33 |
| 3,779,778 | 12/1973 | Smith et al. .......................... 430/270 |
| 3,782,939 | 1/1974 | Bonham et al. ................. 430/270 X |
| 4,284,704 | 8/1981 | Fleming et al. ..................... 430/154 |
| 4,552,830 | 11/1985 | Reardon et al. ..................... 430/281 |

FOREIGN PATENT DOCUMENTS 1286879  8/1972  United Kingdom .

*Primary Examiner*—Roland E. Martin
*Assistant Examiner*—Cynthia Hamilton
*Attorney, Agent, or Firm*—William J. Davis

[57] ABSTRACT

Positive-working imaging compositions comprise a polymeric binder and a quinone sensitizer which provides alkali solubility to the composition when exposed to activating radiation.

6 Claims, No Drawings

PHOTORESIST COMPOSITIONS CONTAINING QUINONE SENSITIZER

FIELD OF THE INVENTION

This invention relates to positive-working imaging compositions suitable for exposure to activating radiation to form a resist image.

BACKGROUND OF THE INVENTION

Resist compositions are facing new challenges in the field of microelectronic fabrication. The need to mass-produce microscopically dimensioned, etched configurations has resulted in demand for resists with the properties of greater speed, higher contrast and better spectral sensitivity so as to improve image resolution and processing flexibility and reduce the unit cost of the end-product electronic device. ("Speed" as used herein refers to the sensitivity of the composition to activating radiation, and is not to be confused with development rate.)

A useful class of positive-working photoresist compositions comprises a polymer containing recurring groups with pendant quinone diazide groups that are light sensitive, and a dissolution inhibitor monomer that tends to insolubilize the polymer in areas wherein the quinone diazide has not been decomposed by exposure to activating radiation. One of the monomer's functions is to thermally convert to a ketene that causes crosslinking, thereby providing thermal resistance, as is well known. Examples are described in U.S. Pat. No. 4,365,019, wherein the monomer comprises, e.g., 1,3,5-trihydroxybenzene esterified with 1,2-naphthoquinone diazide sulfonic acid (NDS). Examples of particularly useful polymers include the so-called Novolak resins, which are well known. The image/nonimage differential of the diazoketone/Novolak photoresist systems hinges on the principal of dissolution inhibition. Resists based on such diazoketone/Novolak positive-working systems have usually functioned very well, however, they are not completely adequate. The availability of a resist composition having higher speed, higher contrast and better spectral sensitivity would greatly expand the possible chemistries and more closely fit the processing format of some circuit designers.

What then has been needed prior to this invention is a positive-working photoresist composition that is capable of higher speed, higher contrast and better spectral sensitivity than the conventional diazoketone/Novolak systems.

SUMMARY OF THE INVENTION

We have discovered novel positive-working photoresist compositions featuring a polymeric binder and a quinone sensitizer.

In accord with the present invention, there is provided a positive-working resist system that is capable of higher speed, higher contrast, and better spectral sensitivity than diazoketone/Novolak systems.

It is another advantageous feature of the invention that such a resist is sensitive to deep UV and electrons.

Yet another advantageous feature of the invention is that the same radiation-sensitive compound providing differential solubility also can provide bleach-out color for the resist.

These features result, more specifically, from a positive-working non-alkali-soluble imaging composition comprising a polymeric binder and a sensitizer effective, when exposed to activating radiation, to provide alkali solubility to the composition. The composition is characterized in that the aforesaid sensitizer comprises a quinone having the structural formula:

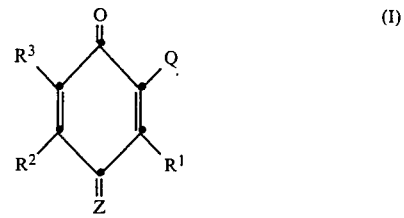

wherein
Q is

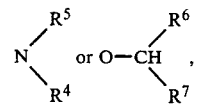

$R^1$ is H, halo, alkyl, alkoxy, aryl, aralkyl, alkaryl, cyano, or a heterocyclic ring,
$R^2$ and $R^3$ are individually H, aryl,

wherein each Ar is aryl, aralkyl or alkaryl, or together comprise 1 or 2 fused carbocyclic rings,
$R^4$ and $R^5$ are individually alkaryl, aralkyl, aryl, alkyl or together comprise a heterocyclic ring,
Z is =O or =NSO$_2$—Ar,
$R^6$ and $R^7$ are individually H, alkyl, aryl, aralkyl, alkaryl, —OH, or together comprise a carbocyclic or heterocyclic ring.

These quinone sensitizers, when contained in an appropriate polymeric binder, provide upon imagewise exposure to radiation, imagewise solubilization by photoreduction. Such solubilization permits development in an aqueous alkali developer.

Other advantageous features of this invention will become apparent upon reference to the following Description of the Preferred Embodiments.

DESCRIPTION OF THE PREFERRED EMBODIMENTS

Certain quinone compounds have been found to be particularly useful when incorporated as sensitizers in positive-working photoresist compositions. Such quinones provide alkali solubility to the resist composition when such composition is exposed to activating radiation. Although these compounds will be discussed primarily in connection with their preferred exposure sources, namely deep UV light sources defined as those having wavelengths including the range 200-300 nm and electron beams, they are also useful with other activating radiation. These light-sensitive quinones are useful with light-sensitive binders as well as with binders which are not light-sensitive.

U.S. Pat. No. 4,522,830 describes negative-working photoresist compositions containing a photoinitiator. Photoinitiators disclosed as useful include organic carbonyl compounds including quinones. However, the photoinitiator serves to initiate the crosslinking of monomers to produce a negative-working composition. U.S. Pat. No. 3,462,267 describes a negative-working printing plate comprising a sensitizing agent. Sensitizing agents disclosed as useful include quinones, which activate the polymerization of prepolymers to form a negative-working system. These references, accordingly, do not teach or suggest the use of quinone sensitizers in positive-working imaging compositions, which sensitizers function to increase alkali solubility upon exposure.

Particularly useful quinones for the resist of this invention comprise those having the structural formula (I) indicated above wherein:

$R^1$ is H; halo; such as fluoro, chloro, bromo or iodo; alkyl preferably containing 1-5 carbon atoms, such as methyl, ethyl, propyl, isopropyl, butyl and the like; alkoxy, preferably containing 1-5 carbon atoms, such as methoxy, ethoxy, propoxy, isopropoxy, butoxy and the like; aryl, preferably containing 6-10 carbon atoms such as phenyl and naphthyl and the like; aralkyl, preferably containing 7-10 carbon atoms, such as benzyl and the like; alkaryl, preferably containing 7-10 carbon atoms such as ethyl benzyl and the like; cyano; or a heterocyclic ring, preferably containing at least one nitrogen ring atom and a total of 5 to 6 ring atoms such as triazolyl, pyrrolyl, oxazinyl, pyridinyl and isomers thereof.

$R^2$ and $R^3$ individually represent H; aryl as described above;

where each Ar is individually aryl, aralkyl or alkaryl as described above; or when taken together, $R^2$ and $R^3$ comprise the number of carbon atoms necessary to complete 1 or 2 fused carbocyclic rings, such rings preferably containing 6 to 10 carbon atoms.

$R^4$ and $R^5$ are individually alkaryl, aralkyl, aryl or alkyl as described above; or taken together, $R^4$ and $R^5$ comprise the number of atoms that complete a heterocyclic ring as described above.

Z is =O or =NSO$_2$—Ar, where Ar is described above.

$R^6$ and $R^7$ are individually H, alkyl, aryl, alkaryl or aralkyl as described above; —OH; or $R^6$ and $R^7$ when taken together comprise the atoms that complete a carbocyclic ring, preferably containing 5-6 ring atoms, or a heterocyclic ring, such as described above.

A preferred class of quinones is represented by the structural formula:

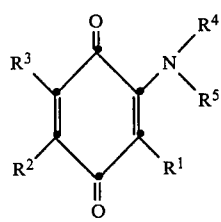

(II)

wherein $R^1$, $R^2$, $R^3$, $R^4$ and $R^5$ are as described above.

Specific quinones having formula (II) above which are useful herein include:

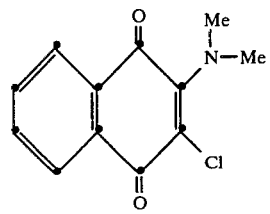
NQ-1

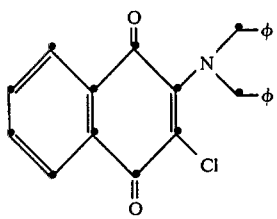
NQ-2

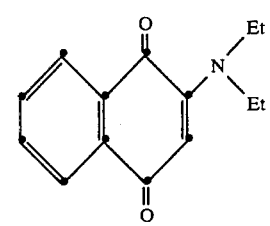
NQ-3

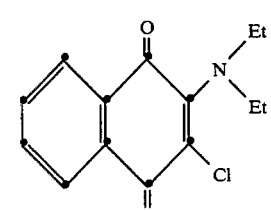
NQ-4

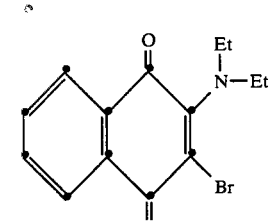
NQ-5

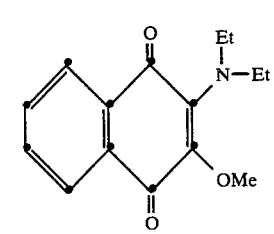
NQ-6

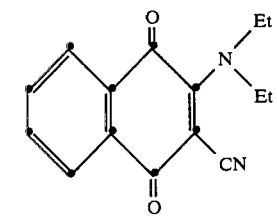
NQ-7

-continued
NQ-8 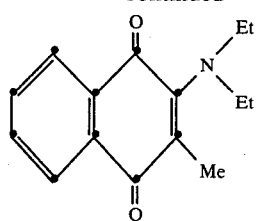
NQ-9 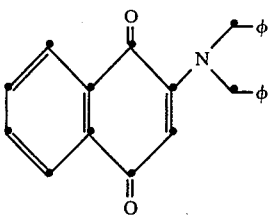
NQ-10 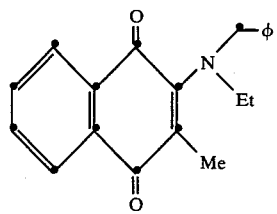
NQ-11 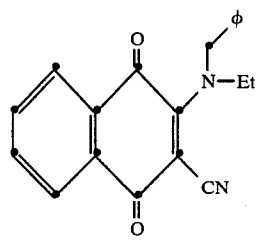
NQ-12 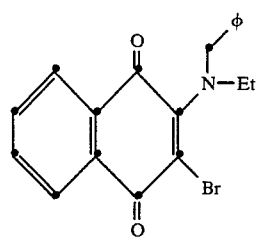
NQ-13 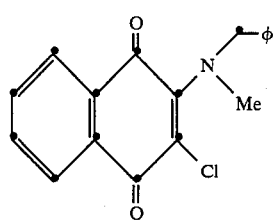
NQ-14 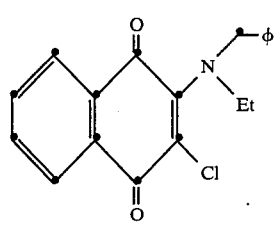
-continued
NQ-15 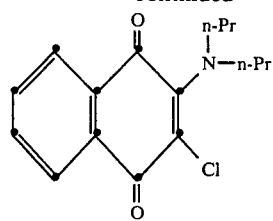
AQ-1 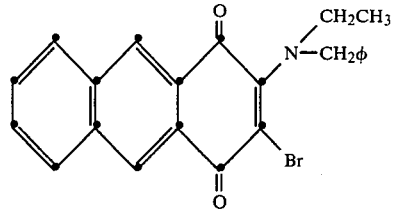
AQ-2 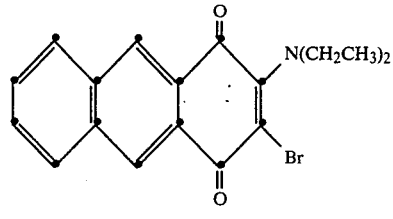
AQ-3 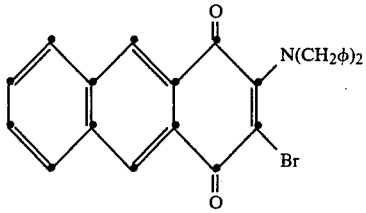
BQ-1 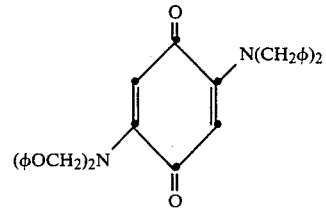
Another preferred class of quinones is represented by the structural formula:
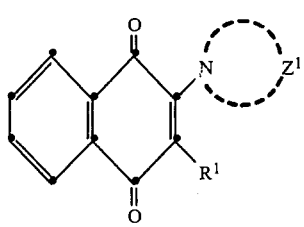
(III)
wherein $R^1$ is as defined above; and $Z^1$ is the number of atoms necessary to complete a heterocyclic ring as described for $R^1$ above.
Specific quinones having formula (III) which are useful herein include:

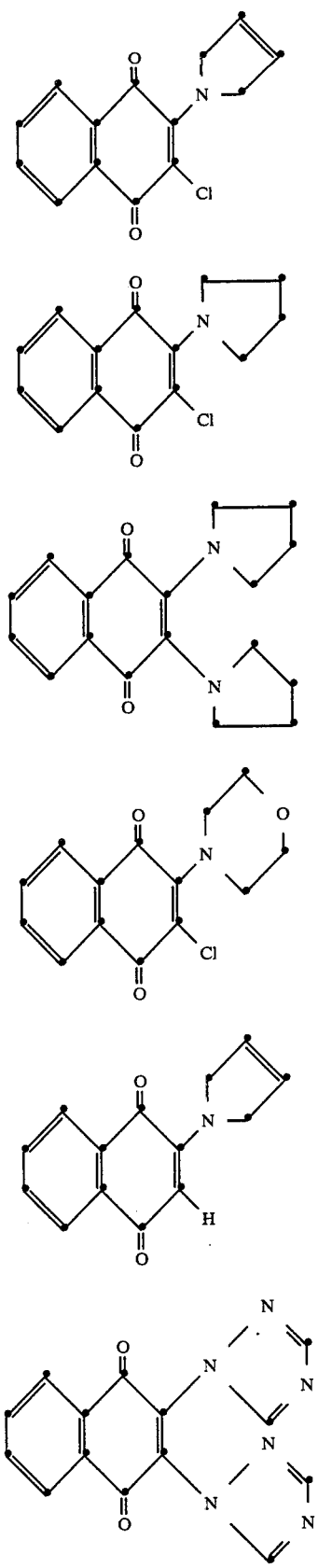
NQ-16
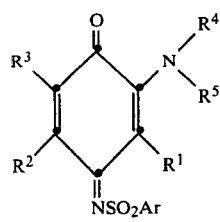
(IV)
wherein $R^1$, $R^2$, $R^3$, $R^4$, $R^5$ and Ar are as defined above.
Specific quinones having formula (IV) which are useful herein include:
NQ-17
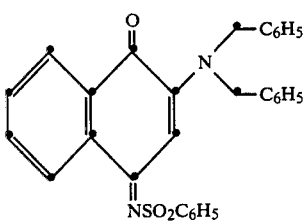
IQ-1
NQ-18
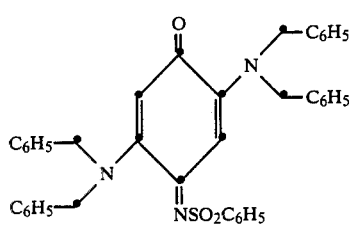
IQ-2
NQ-19
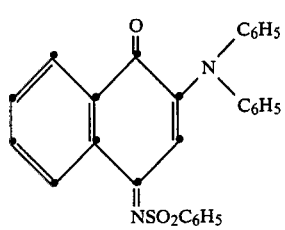
IQ-3
NQ-20
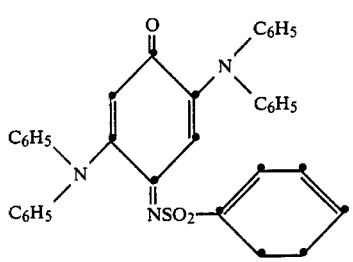
IQ-4
NQ-21
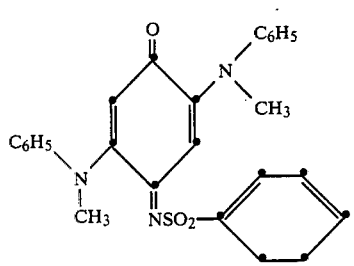
IQ-5
Yet another preferred class of quinones is represented by the structural formula:

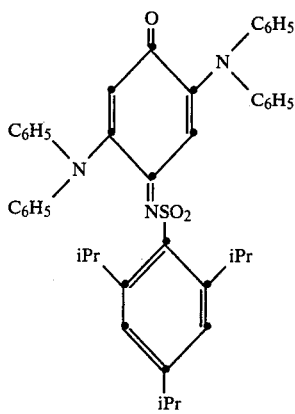
IQ-6

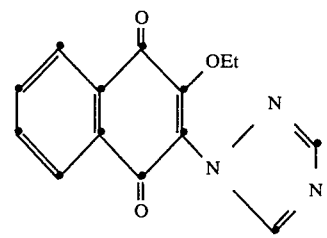
NQ-24

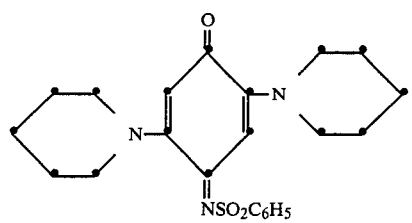
IQ-7

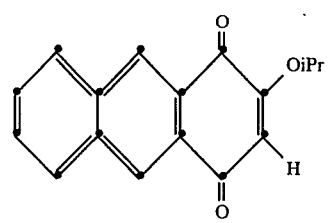
AQ-4

Still another preferred class of quinones is represented by the structural formula:

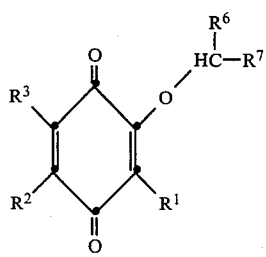
(V)

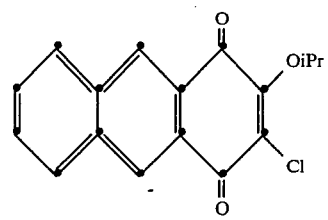
AQ-5 wherein $R^1$, $R^2$, $R^3$, $R^6$ and $R^7$ are as described above.

Specific quinones having formula (V) which are useful herein include:

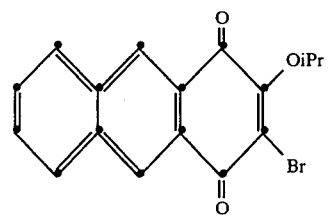
AQ-6

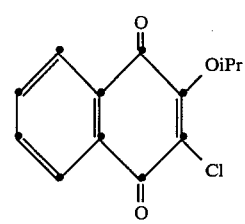
NQ-22

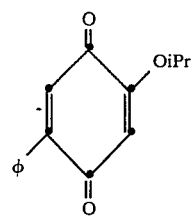
BQ-2

The quinone sensitizers of this invention are known compounds and can be prepared by methods known in the art. A general reaction scheme for synthesizing quinones having formula (I) wherein Z is $NHSO_2$—Ar is illustrated by the following:

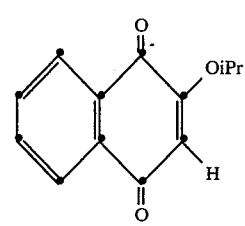
NQ-23

Reaction scheme for synthesizing 2,5-dibenzylamino-p-benzoquinone monobenzene sulfonimide (2) from p-benzoquinone-monobenzene sulfonimide (1)

Step 1:

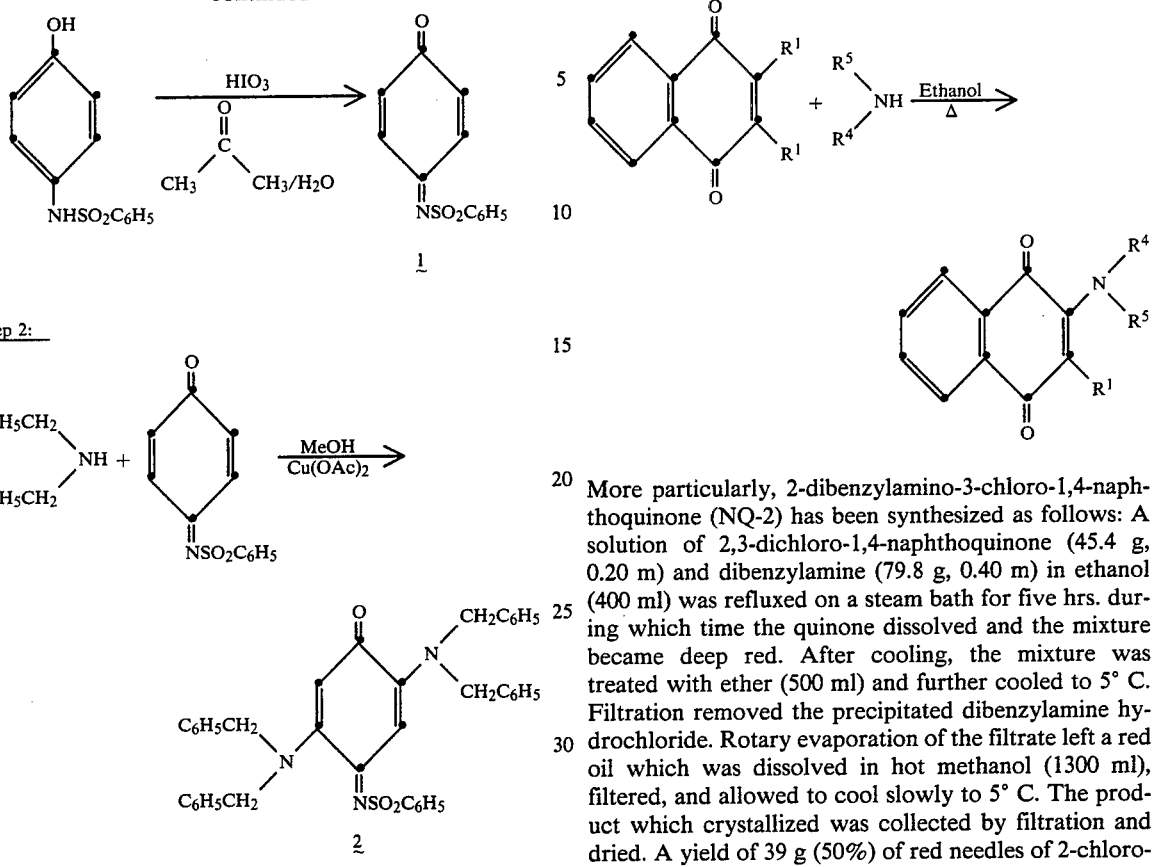

Step 1: Preparation of p-benzoquinone-monobenzene sulfonamide (1)

To a solution of 25 g p-benzenesulfonamidophenol in 200 ml of 50:50 H$_2$O: acetone was added dropwise a solution of 18 g HIO$_3$ in 75 ml H$_2$O. As the reaction proceeded, the solution warmed, turned deep red and began depositing a yellow solid. It was stirred a total of one hour, filtered, washed with H$_2$O and air dried. Yield 20 g. M.P. 125°–135° C. The material was used without further purification for Step 2.

Step 2: Preparation of 2,5-dibenzylamino-p-benzoquinonemonobenzenesulfonimide (2)

4.0 g cupric acetate was dissolved in 300 ml anhydrous methanol followed by 15.0 g dibenzylamine. The solution turned deep blue. 5 g of p-benzoquinonemonobenzenesulfonimide was added in one portion. The reaction was protected from light and stirred for four hours. The precipitate was filtered off and washed with methanol followed by water. One crystallization from methanol yielded 8 g dark purple crystals. M.P.-104°–6° C.

Calculated: C, 75.3; H, 5.5; N, 6.6; S, 5.0. Found: C, 75.3; H, 5.3; N, 6.6; S, 5.0.

Synthesis of quinones having formula (II) useful in the practice of this invention can proceed generally as follows:

More particularly, 2-dibenzylamino-3-chloro-1,4-naphthoquinone (NQ-2) has been synthesized as follows: A solution of 2,3-dichloro-1,4-naphthoquinone (45.4 g, 0.20 m) and dibenzylamine (79.8 g, 0.40 m) in ethanol (400 ml) was refluxed on a steam bath for five hrs. during which time the quinone dissolved and the mixture became deep red. After cooling, the mixture was treated with ether (500 ml) and further cooled to 5° C. Filtration removed the precipitated dibenzylamine hydrochloride. Rotary evaporation of the filtrate left a red oil which was dissolved in hot methanol (1300 ml), filtered, and allowed to cool slowly to 5° C. The product which crystallized was collected by filtration and dried. A yield of 39 g (50%) of red needles of 2-chloro-3-dibenzylamino-1,4-naphthoquinone of m.p. 77°–79° C. was thus obtained. Other quinones useful in the practice of the present invention can be prepared similarly as well as by other known methods.

The positive-working resist compositions of this invention comprise a polymer binder and the aforedescribed quinone sensitizer. Other addenda can be optionally added to the composition, for example, stabilizers, surfactants and/or development accelerators as described in U.S. Pat. No. 4,365,019. The imaging composition must be substantially free of compounds that would polymerize or crosslink in response to the light-activated form of the quinone.

The amounts of the components of the resist composition vary, depending upon the use and exposure source intended. The quinone sensitizer typically is present in range of 5 to 50 weight percent, preferably 10 to 30 weight percent based on the weight binder.

Useful soluble binders include phenol formaldehyde resins and other phenolic polymers. Particularly useful examples and a preferred class of binders include the well-known Novolak resins, that is, those having the structural formula:

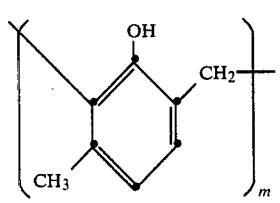

Other phenolic polymers expected to be useful herein include polyvinyl phenol, poly(p-hydroxystyrene), and poly(hydroxyphenyl maleimide). If the binder is a phenol-formaldehyde resin or another phenolic polymer, then Q must be

and the first atom of $R^4$ or $R^5$ attached to N must have an abstractable hydrogen bonded to it, as is illustrated by the working examples which follow. It is believed that the abstractable hydrogen is required for the photo-conversion, in the presence of the Novolak, of the alkali-insoluble quinone to the alkali-soluble hydroquinone.

Another preferred class of binders useful herein is the polysulfonamides, particularly those containing the following as recurring units:

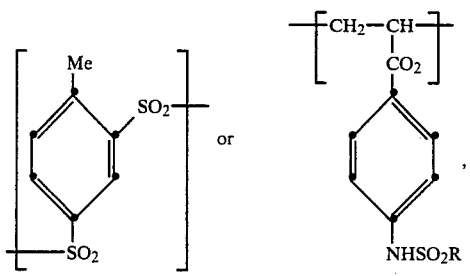

where R=H, alkyl or aryl.
The following sulfonamides are also expected to be useful herein:

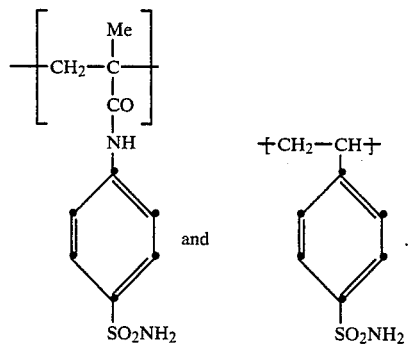

The sulfonamides are useful as homopolymers or can be copolymerized with polystyrene, poly(methylmethacrylate), etc.

Additional examples of binders useful herein include poly(dimethylglutarimide), vinyl-addition polymers such as acrylates or methacrylates copolymerized with acrylic or methacrylic acid. Other vinyl-addition polymers, examples of which are set forth in U.S. Pat. No. 4,141,733, are also expected to be useful herein.

The resist composition of the invention is preferably applied to a suitable support and contact or projection-exposed imagewise to activating radiation such as light or E-beam radiation. The "images" that are useful include conventional micro images, such as those useful in forming integrated circuits. Useful supports include sheets and foils of such metals as aluminum, copper, magnesium, zinc, etc.; glass and glass coated with such metals as chromium, chromium alloys, steel, silver, gold, platinum, etc.; synthetic polymeric materials such as poly(alkyl methacrylates), e.g., poly(methylmethacrylate), polyester film base, e.g., poly(ethyleneterephthalate), poly(vinyl acetals), polyamides, e.g., nylon, cellulose ester film base, e.g., cellulose nitrate, cellulose acetate, cellulose acetate propionate and cellulose acetate butyrate. For the manufacture of integrated circuit devices, silicon or silicon dioxide wafers, as well as silicon nitride and chromium-coated glass plate supports, are particularly useful. Depending upon the support selected, adhesion aids are optionally applied first as a sub-coating.

Any conventional method can be used to apply the composition to the support. The preferred method is as a coating using an appropriate solvent. Useful coating techniques include spin coating, whirler-coating, spray coating, curtain coating, and roll coating. The solvent used to prepare the resist composition for coating can be selected from any conventional coating solvent. Useful solvents include alcohols, esters, ethers, and ketones and particularly ethanol, 2-ethoxyethyl acetate, n-butyl acetate, 4-butyrolactone, and mixtures thereof.

Preferred final thicknesses of the coatings vary, depending upon the final use and the etchants that are to be used, if any. Examples of preferred thicknesses range from between about $0.5\mu$ to about $20\mu$.

The pre-bake and post-bake techniques described in U.S. Pat. No. 4,141,733 are preferred for the invention.

The equipment used to expose the resist is conventional. The exposure times vary depending on the desired results and equipment used, preferred times being in the range of about 5 sec. to about 90 sec. It is the speed, i.e. the sensitivity of the compositions of this invention to activating radiation, which is markedly improved as compared to conventional resist compositions.

Following exposure, the imaging composition is developed with an appropriate alkali developer. Useful developers include conventional, positive-working developers. For example, those containing sodium hydroxide or phosphate, and those described in U.S. Pat. No. 4,141,733 and European Pat. No. 23,758, e.g., quaternary alkanol ammonium hydroxides containing a sulfite stabilizer are particularly useful.

Following development, conventional wet or dry etching processes are useful to etch away the support in the areas left unprotected by the development step.

EXAMPLES

The following examples further illustrate the scope of the invention.

EXAMPLE 1

A comparison between a Quinone-Novolak System of the invention and a Diazoketone/Novolak System The following coating solutions were prepared:

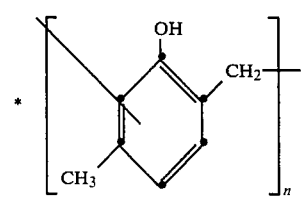

The photosensitizers included NDS as a control and NQ-16, NQ-2, IQ-1 and IQ-2 quinones:

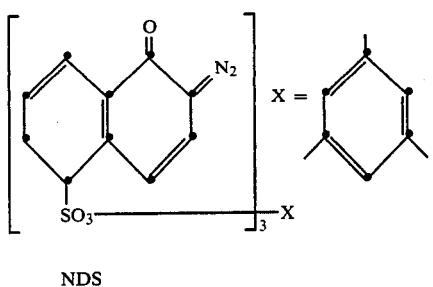

NDS

The coating solutions were coated on a poly(ethylene terephthalate) support at 3 microns thickness at 26°–27° C. and dried at 60° C. for 30 minutes. Samples of each coating were exposed for 10 sec to the IBM Microcopier IID exposing device through a step tablet and a resolution test target. The NDS control sample on exposure bleached off to give a positive clear image on yellow background which was not visible under yellow light. By contrast, the orange-red quinone samples of the invention produced bleached-out images which were readily visible under yellow light. The exposed samples were processed for 30–90 sec in a 1% NaOH developer solution. The NDS control gave a positive resist image of lower contrast and lower speed than the quinones. Its spectral response is also limited to 330–480 nm with a maximum at 420 nm. The spectral sensitivity of NQ-1 and NQ-2 extended from 250 nm to 630 nm with a maximum at 490–500 nm. The spectral sensitivity of IQ-1 extended from 250 nm to 580 nm with a maximum at 400 nm. IQ-2 exhibited a λmax at 420 nm and a cut-off at 480 nm. The absolute sensitometry in mj/cm² of NDS, NQ-16 and IQ-2 at various wavelengths is summarized in Table I. Numbers in mj/cm² refer to light energy required to remove half-thickness of the resist layer.

TABLE I

Sensitometry of Quinone/Novolak vs NDS/Novolak Photoresist

| Sensitizer | 266 nm (deep-uv) | 330 nm | 420 nm (mid-uv) | 500 nm |
|---|---|---|---|---|
| NDS | very slow | 320 mj/cm² | 140 mj/cm² | none |
| NQ-16 | 80 mj/cm² | 420 mj/cm² | 400 mj/cm² | 95 mj/cm² |
| IQ-2 | 150 mj/cm² | not tested | 190 mj/cm² | not tested |

Samples of NQ-16 and NQ-2 were also spin coated at 2000 and 3500 rpm on chromium-clad glass to form films of 2.2 and 1.8 microns thickness, respectively. They were exposed to a mercury light source (15 sec) through a high resolution test target and developed in 1% NaOH to produce excellent positive resist images. The line pairs which were resolved had 1 μm linewidth.

EXAMPLE 2

Other Quinones which are Effective Sensitizers in Novolak Resin

The following quinones were tested in the format described in Example 1 and found to be effective sensitizers in Novolak resin. Their λ-max are listed in Table II.

TABLE II

| Sensitizer | λ-max | Sensitizer | λmax |
|---|---|---|---|
| NQ-1 | 493 | NQ-15 | 500 |
| NQ-3 | 463 | NQ-17 | 480 |
| NQ-4 | 493 | NQ-18 | 491 |
| NQ-5 | 502 | NQ-19 | 490 |
| NQ-6 | 508 | NQ-20 | 460 |
| NQ-7 | 432 | IQ-3 | 400,500 |
| NQ-8 | 510 | IQ-4 | 420 |
| NQ-9 | 453 | IQ-5 | 420 |
| NQ-10 | 492 | IQ-6 | 420 |
| NQ-11 | 432 | IQ-7 | 430 |
| NQ-12 | 495 | AQ-2 | 412,483 |
| NQ-13 | 488 | BQ-1 | 368,510 |
| NQ-14 | 490 | | |

The following quinones were tested in identical format but were found to give no resist image: NQ-21, NQ-22, NQ-23, NQ-24, AQ-4, AQ-5 and AQ-6. Other quinones tested in Novolak not having a

group, or having a

group but not containing an abstractable hydrogen on the first atom of $R^4$ or $R^5$ attached to N, similarly gave no resist image. These quinones are presumed to form a strong charge transfer complex with the phenolic moiety of the Novolak which results in shutting off their ability to undergo photochemical change.

EXAMPLE 3

E-beam Sensitivity of NQ-16 and NQ-2 in Novolak

A sample of the coating solution of NQ-16 and NQ-2 prepared as in Example 1 was spin coated on chromium-clad glass at a spinning rate of 5000 rpm to produce 1 micron film coatings. These coatings were then baked at 90° C. for 30 minutes and were exposed to a 10 Kv electron beam. The exposed samples were processed for 90 sec in 1% NaOH developer to form positive resist images. The sensitivity to electrons was estimated to be approximately $4 \times 10^{-6}$ coulomb/cm² for both NQ-16 and NQ-2.

EXAMPLE 4

The Oleophilicity and Ink Receptivity of the Quinone/Novolak System

A coating solution identical to that of Example 1 was prepared except NQ-14 was used as the sensitizer. The solution was coated on a lithographic paper support and was exposed and processed for 90 sec on 1% NaOH to form positive resist images. Water was then applied to these images together with a black printing ink. Only the unexposed areas were shown to receive the ink whereas the background received only water and remained clear.

EXAMPLE 5

Photoreduction of a quinone in a resist composition containing polysulfonamide

The following coating solutions were prepared:

|  |  | Solution A | Solution B | Solution C |
|---|---|---|---|---|
| Solvent | 14 g | Acetone | Acetone | Acetone |
| Binder | 6 g | Novolak | A2Cy* | A2Cy |
| Sensitizer | 1.2 g | NQ-22 | NQ-22 | NDS |

*A2Cy polysulfonamide = Poly(ethylene-co-1,4-cyclohexylenedimethylene-1-methyl-2,4-benzenedisulfonamide)

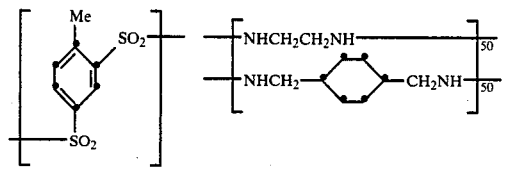

The coating solutions were coated on a poly(ethylene terephthalate) support at 3 microns thickness at 26°–27° C. and dried at 60° C. for 30 minutes. Samples of each coating were exposed for 10 sec to the IBM Microcopier IID exposing device through a step tablet and a resolution test target. The exposed samples were processed for 30 sec in a 1% NaOH developer solution.

Coating A gave no observable change, indicating that there was no photochemistry occurring. Coating B produced a print-out image which upon development gave a positive clear image on a yellow background. Coating C also produced a bleach-out image but development of the image in aqueous NaOH resulted in the formation of a red dye which could not be washed out into the developer solution even with vigorous agitation. This example shows that NQ-22, although ineffective in Novolak, is an effective sensitizer in A2Cy; and in combination with the A2Cy binder, it forms a better positive-working image system than NDS (diazoketone) with A2Cy.

EXAMPLE 6

Photoreduction of NQ-2, an aminoquinone, with A2Cy binder

A coating identical to A in Example 4 was prepared except NQ-2 was used instead of NQ-22. On exposure this coating produced a bleach-out image which could be developed in 30 sec in 1% NaOH to produce a positive orange-red resist image.

A sample of the coating solution containing NQ-2 as the sensitizer was also spin-coated on chromium-clad glass at a spinning rate of 5000 rpm to form a dry layer of 1.8 μm thickness. The coating was baked at 90° C. for 30 minutes followed by exposure through a high resolution test object (15.0 sec mercury vapor light source). Development for 15 sec in 1% NaOH solution produced excellent resist images which showed well resolved lines of less than one micron.

This example demonstrates that NQ-2 can also be utilized effectively as a sensitizer with A2Cy as a binder.

EXAMPLE 7

Effect of other photosensitive quinones as sensitizers with A2Cy binder

The following quinones were tested in A2Cy polysulfonamide at a sensitizer to binder ratio of 1:5 (Example 4B). The exposed films were processed in 1% NaOH for 30 sec followed by a water wash. All of these coatings responded positively to exposure by producing either a print-out or bleach-out image at various rates. However their development characteristics were greatly different. Some gave excellent image differential and therefore excellent image quality. Others gave less desirable image differential, presumably due to a lesser ability to inhibit dissolution. However when these quinones were tested in Novolak, all, with the exception of NQ-16 and NQ-2, (the amino substituted quinones) gave negative results. Test results for the A2Cy polysulfonamide series are summarized in Table III.

TABLE III

| Sensitizer | λmax (nm) | Quality of Resist Image |
|---|---|---|
| NQ-2 | 490 | excellent |
| NQ-16 | 477 | excellent |
| NQ-21 | 335 | good |
| NQ-22 | 335 | good |
| NQ-23 | 327 | fair |
| NQ-24 | 332 | good |
| AQ-4 | 400 | good |
| AQ-5 | 407 | excellent |
| AQ-6 | 406 | excellent |

EXAMPLE 8

Utility of other polysulfonamides as effective binders for quinones

Coatings were prepared as in Example 4 using the following coating solutions in which the A2Cy polymer was replaced by two other polysulfonamides, A5 and JW 100.

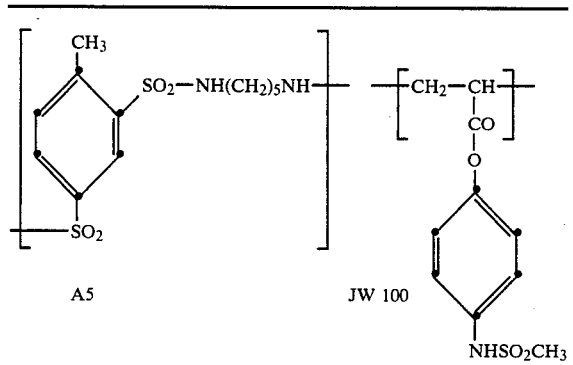

|  | Solution A | Solution B |
|---|---|---|
| Solvent | 14 g Acetone | 14 g Acetone |
| Binder | 6 g A5 | 3 g JW 100 |
| Sensitizer | 1.2 g NQ-21 | 0.6 g NQ-21 |

They were exposed and processed identically as in Example 4 to produce good positive resist images.

EXAMPLE 9

Use of Quinones as Effective Sensitizers with Poly(methylmethacrylate-co-methacrylic acid) as binder Similar tests were conducted using a poly(methylmethacrylate-co-methacrylic acid) copolymer (MmE-75)* instead of a polysulfonamide. Table IV lists the quinones that were tested and shown to be effective sensitizers in MmE-75.

TABLE IV

*MmE-75 —[—CH₂C(Me)(CO₂Me)—]₇₅[—CH₂—C(Me)(CO₂H)—]₂₅

| Sensitizer | λmax(nm) |
|---|---|
| NQ-22 | 335 |
| NQ-23 | 327 |
| NQ-24 | 335 |
| BQ-2 | 310 |
| AQ-4 | 400 |

The invention has been described in detail with particular reference to preferred embodiments thereof, but it will be understood that variations and modifications can be effected within the spirit and scope of the invention.

What is claimed is:

1. A positive-working imaging composition comprising a polymer binder and a sensitizer effective, when exposed to activating radiation, to provide alkali solubility to said composition, characterized in that said sensitizer comprises a quinone having the structural formula:

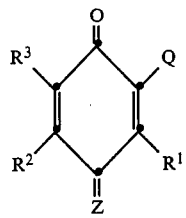

wherein
Q is

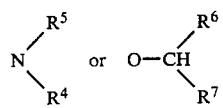

$R^1$ is H, halo, akyl, alkoxy, aryl, aralkyl, alkaryl, cyano, or a heterocyclic ring,
$R^2$ and $R^3$ are individually H, aryl, alkaryl,

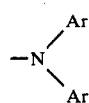

where each Ar is individually aryl, aralkyl, or alkaryl or together $R^2$ and $R^3$ comprise the number of carbon atoms that complete 1 or 2 fused carbocyclic rings,
$R^4$ and $R^5$ are individually alkyl, alkaryl, aralkyl, aryl, or together $R^4$ and $R^5$ comprise the number of atoms that complete a heterocyclic ring,
Z is =O or =NSO₂—Ar, where Ar is defined above,
$R^6$ and $R^7$ are individually H, alkyl, aryl, alkaryl, aralkyl, —OH, or together $R^6$ and $R^7$ comprise the atoms that complete a carbocyclic or heterocyclic ring.

2. The composition of claim 1 wherein said sensitizer comprises a quinone having the structural formula

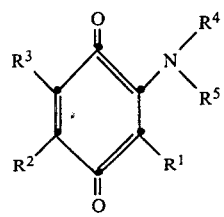

wherein $R^1$, $R^2$, $R^3$, $R^4$, and $R^5$ are as defined in claim 1.

3. A composition of claim 1 wherein said sensitizer comprises a quinone having the structural formula:

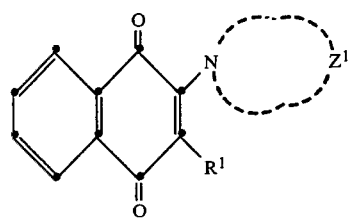

wherein
$R^1$ is as defined in claim 1;
and $Z^1$ is the number of atoms necessary to complete a heterocyclic ring containing 5 to 6 ring atoms.

4. A composition as defined in claim 1, wherein said quinone is selected from the group consisting of:
2-Benzylethylamino-3-chloro-1,4-naphthoquinone,
2-Dibenzylamino-3-chloro-1,4-naphthoquinone,
2-Diethylamino-3-chloro-1,4-naphthoquinone,
2-Diethylamino-3-cyano-1,4-naphthoquinone,
2-Benzylethylamino-3-bromo-1,4-naphthoquinone,
2-Diethylamino-3-methyl-1,4-naphthoquinone,
2-Chloro-3-isopropoxy-1,4-anthraquinone,
2-Bromo-3-isopropoxy-1,4-anthraquinone, and
2-Chloro-3-(3-pyrrolyl)-1,4-naphthoquinone.

5. The composition of claim 1 wherein said sensitizer comprises a quinone having the structural formula

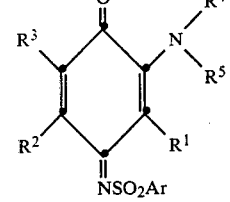

wherein $R^1$, $R^2$, $R^3$, $R^4$, $R^5$ and Ar are as defined in claim 1.

6. The composition of claim 1 wherein said sensitizer comprises a quinone having the structural formula:

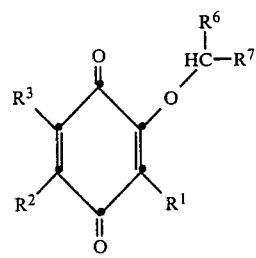

wherein $R^1$, $R^2$, $R^3$, $R^6$ and $R^7$ are as defined in claim 1.

* * * * *